(12) United States Patent
Roe

(10) Patent No.: US 6,798,257 B1
(45) Date of Patent: Sep. 28, 2004

(54) METHOD AND APPARATUS FOR PROVIDING MULTIPLE CLOCK SIGNALS ON A CHIP USING A SECOND PLL LIBRARY CIRCUIT CONNECTED TO A BUFFERED REFERENCE CLOCK OUTPUT OF A FIRST PLL LIBRARY CIRCUIT

(75) Inventor: David Glen Roe, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 188 days.

(21) Appl. No.: 09/814,244

(22) Filed: Mar. 21, 2001

(51) Int. Cl.[7] .............................................. H03L 7/06
(52) U.S. Cl. ..................................... 327/147; 327/156
(58) Field of Search ................................ 327/147–162

(56) References Cited

U.S. PATENT DOCUMENTS

| | | | | |
|---|---|---|---|---|
| 5,124,569 A | * | 6/1992 | Phillips ...................... | 327/150 |
| 5,495,207 A | | 2/1996 | Novof | |
| 5,513,225 A | | 4/1996 | Kelkar et al. | |
| 5,525,932 A | | 6/1996 | Kelkar et al. | |
| 5,541,442 A | | 7/1996 | Keil et al. | |
| 5,546,052 A | | 8/1996 | Austin et al. | |
| 5,565,928 A | * | 10/1996 | Saeger et al. ............... | 348/540 |
| 5,619,161 A | | 4/1997 | Novof et al. | |
| 5,698,876 A | * | 12/1997 | Yabe et al. .................. | 257/296 |
| 5,977,806 A | * | 11/1999 | Kikuchi ....................... | 327/157 |
| 6,229,399 B1 | * | 5/2001 | Tobise et al. ................. | 331/17 |
| 6,240,152 B1 | * | 5/2001 | Ho .............................. | 375/376 |
| 6,272,669 B1 | * | 8/2001 | Anderson et al. ............ | 716/16 |

FOREIGN PATENT DOCUMENTS

JP  10135786 A  *  5/1998  ............. H03J/5/02

OTHER PUBLICATIONS

"Phase–Locked Loop," ASIC SA–27 Databook, Document No. SA14–2214–02, IBM Corp., Aug. 24, 1999, pp. 825–866.

"Phase–Locked Loop," ASIC SA–27 Databook, Document No. SA14–2214–02, IBM Corp., Nov. 10, 2000, pp. 895–936.

* cited by examiner

*Primary Examiner*—Timothy P. Callahan
*Assistant Examiner*—Cassandra Cox
(74) *Attorney, Agent, or Firm*—The Law Office of Kirk D. Williams

(57) ABSTRACT

Methods and apparatus are disclosed for providing multiple clock signals on a chip using a second phase-locked loop library circuit connected to a buffered reference clock output of a first PLL library circuit which may be used, inter alia, in a computer or communications system, such as a computer or communications device, packet switching system, router, other device, or component thereof. Known prior circuits would typically use multiple off-chip reference clock signals for those applications that require multiple reference clocks. Implementations according to the invention may be particularly useful for possibly providing a lower-cost solution when, for example, such a circuit provides the capability to maintain tight timing, without sacrificing input pins, or excessively loading the PC board's clock driver. Various implementations of such circuits include an ASIC or those using any chip implementation technology or combinations of technologies, including but not limited to VLSI design and discrete components.

6 Claims, 5 Drawing Sheets

**PLL7SLIBE

**PLL7SLIBI

PLL LOW-LEVEL BLOCK DIAGRAM

METHOD AND APPARATUS FOR PROVIDING MULTIPLE CLOCK SIGNALS ON A CHIP USING A SECOND PLL LIBRARY CIRCUIT CONNECTED TO A BUFFERED REFERENCE CLOCK OUTPUT OF A FIRST PLL LIBRARY CIRCUIT

FIELD OF THE INVENTION

This invention relates to electronic circuitry and phase-locked loops; and more particularly, the invention relates to providing multiple clock signals on a chip using a second phase-locked loop (PLL) library circuit connected to a buffered reference clock output of a first PLL library circuit.

BACKGROUND OF THE INVENTION

Application-specific integrated circuits (ASICs) have increasingly added internal PLLs to achieve high-frequency internal clocks, and adjust internal clock edges at the input of the internal flip-flops to match the edges of the external clocks. The aligning of these internal clocks with the external clocks allows high-frequency external interfaces to communicate with the ASIC.

Most ASIC vendors provide PLL library circuits or macros that support internal reference clocks and PLL library circuits or macros that support external-capable reference clocks. For example, illustrated in FIG. 1A is a block diagram of a prior art library PLL circuit 110 (IBM's PLL7SLIBE) receiving a reference clock from an external source. As shown, prior art library PLL circuit 100 provides for an external reference clock input 109, a buffered reference clock output 105 which is a non-inverted representation of the signal received at reference clock input 109, and three phase-locked loop clock outputs 101–103.

Illustrated in FIG. 1B is a block diagram of a prior art library PLL circuit 110 receiving a reference clock from an internal source. As shown, prior art library PLL circuit 110 provides for an external reference clock input 119, a buffered reference clock output 115, and three phase-locked loop clock outputs 111–113.

FIG. 1C further illustrates these library circuits 100 and 110 (FIGS. 1A–B) by providing a prior art low-level block diagram of the PLL circuit 150 used in library circuits 100 and 110. As shown, prior art library PLL circuit 150 provides for a reference clock input 159, a buffered reference clock output 165 which is a non-inverted representation of the signal received at reference clock input 159, and three phase-locked loop clock outputs 171–173.

The documentation on these library circuits teaches that when using the PLL7SLIBE library circuit 100 (FIG. 1A), REFCLK input 109 connects directly to a chip pad, while when using the PLL7SLIBI library circuit 110 (FIG. 1B), REFCLK input 119 typically connects to the output of a receiver. BUFREFCLK 105 and 115 (FIGS. 1A and 1B) are a buffered version of the reference clock input to the PLL 100 and 105 at respective REFCLK inputs 109 and 119. The use of BUFREFCLK 105 and 115 are optional, but they are available for applications that need the REFCLK signal for other functions. The mechanisms and characteristics of the internal logic used to generate the signals produced from BUFREFCLK 105 and 115 are typically not disclosed, and thus, the exact nature of these signals produced are questionable.

Typically, in PLL library circuits, such as those illustrated in FIGS. 1 A–B and 2, the skew (i.e., difference in edge-adjustment capability) is a function of, inter alia, the input delay through the I/O cell of the reference clock of the internal PLL, the trace length, and process effects. The external-reference PLL is typically only limited by the pin-die delay, and that is less process-variant, and is adjusted for in the layout.

Certain applications require the uses of clocks at multiple frequencies. In some cases, these multiple clock signals are produced by a single PLL or by receiving multiple clock signals from external sources. Especially because of the prohibitive cost of multiple reference clocks and the excessive loading by multiple PLLs using the same external reference (e.g., either both internal PLLs use the same output of an input buffer, or both external PLLs use two pin inputs to bring in the reference clock which increases the load of the clock on the board or doubles the number of clocks to provide to each ASIC), needed are new methods and systems for providing multiple clock signals on a chip.

SUMMARY OF THE INVENTION

Apparatus and methods are disclosed for providing multiple clock signals on a chip using a second phase-locked loop (PLL) library circuit connected to a buffered reference clock output of a first PLL library circuit. One embodiment comprises a first phase-locked loop circuit including an off-chip reference clock input, one or more phase-locked loop clock outputs, and a buffered reference clock output. The embodiment additionally comprises a second phase-locked loop circuit including an on-chip reference clock input and one or more phase locked loop clock outputs, wherein the buffered reference clock output of the first phase-locked loop circuit is electrically coupled to the on-chip reference clock input of the second phase-locked loop circuit.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Figure 1A:
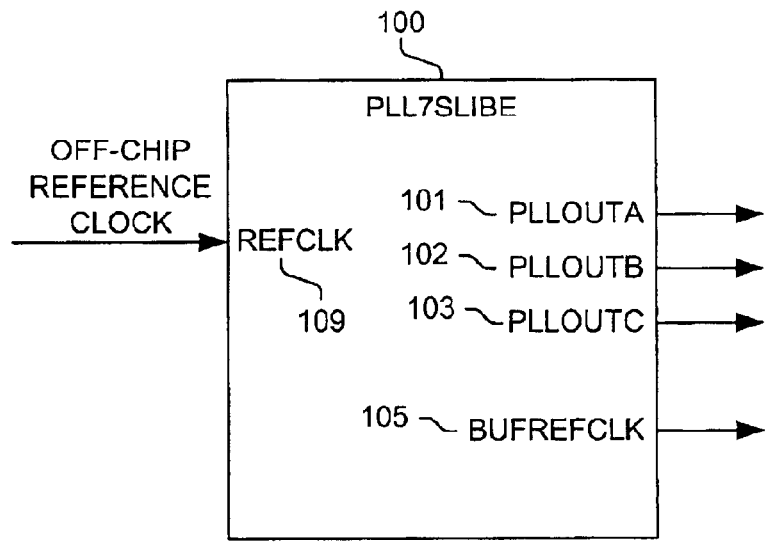
FIGS. 1A–B are block diagrams illustrating two prior art library PLL circuits.
Figure 1B:
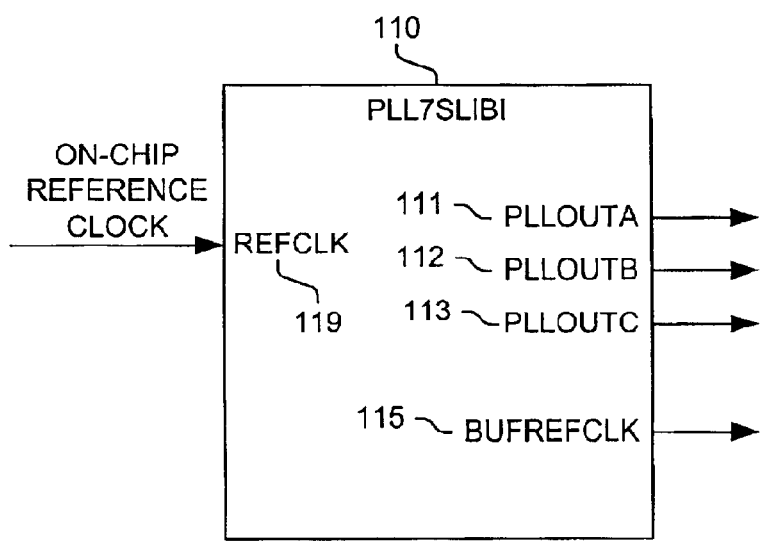
Figure 1C:
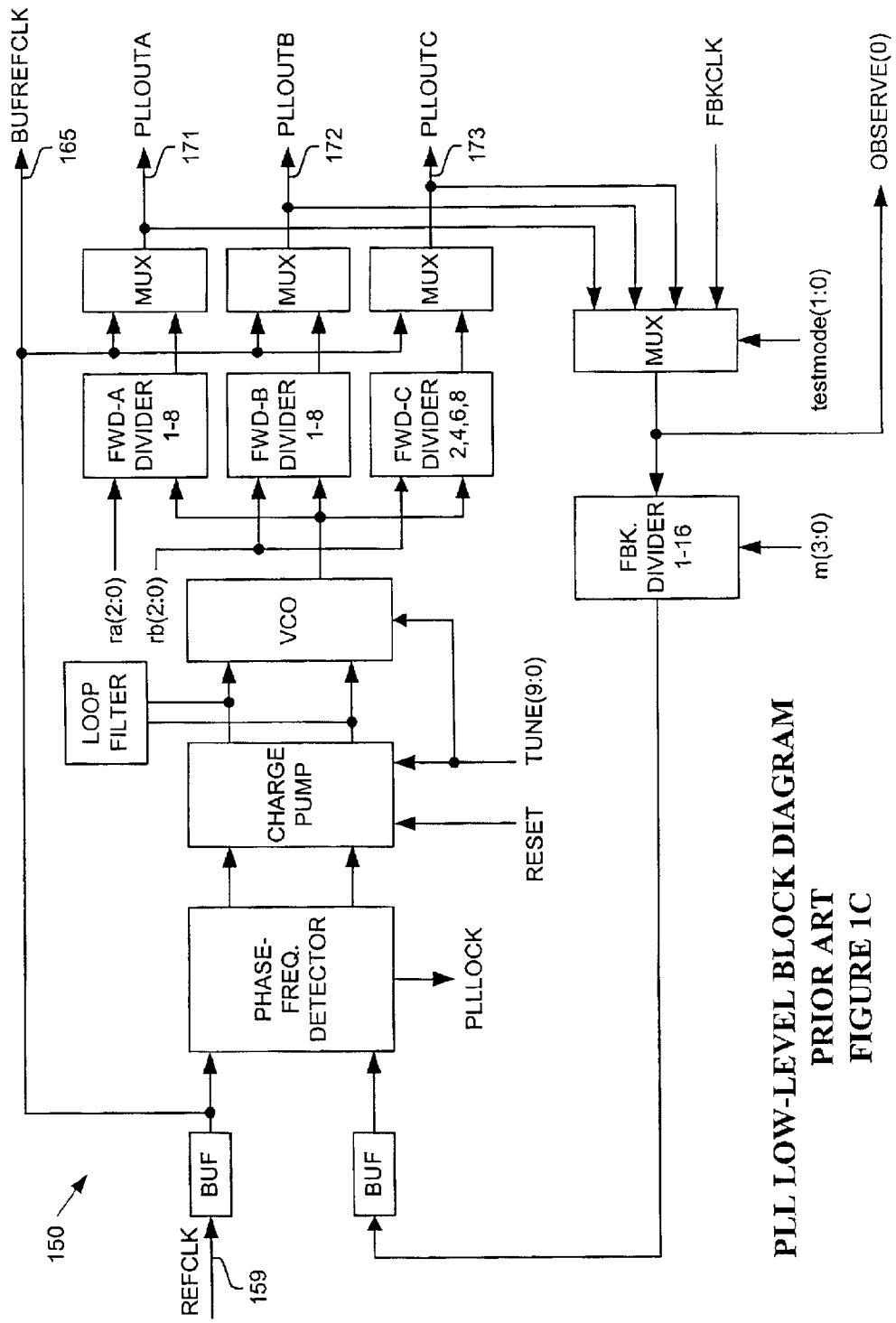
FIG. 1C is a prior art PLL low-level block diagram.

Methods and apparatus are disclosed for providing multiple clock signals on a chip using a second phase-locked loop library circuit connected to a buffered reference clock output of a first PLL library circuit which may be used, inter alia, in a computer or communications system, such as a computer or communications device, packet switching system, router, other device, or component thereof. Such methods and apparatus are not limited to use in a single computer or communications system. Rather, the architecture and functionality taught herein are extensible to an unlimited number of computer and communications systems, devices and embodiments in keeping with the scope and spirit of the invention. Embodiments described herein include various elements and limitations, with no one element or limitation contemplated as being a critical element or limitation. Each of the claims individually recite an aspect of the invention in its entirety. Moreover, some embodiments described may include, but are not limited to, inter alia, systems, integrated circuit chips, embedded processors, ASICs, and methods. The embodiments described hereinafter embody various aspects and configurations within the scope and spirit of the invention.

Methods and apparatus are disclosed for providing multiple clock signals on a chip using a second phase-locked loop library circuit connected to a buffered reference clock output of a first PLL library circuit which may be used, inter alia, in a computer or communications system, such as a computer or communications device, packet switching system, router, other device, or component thereof. Known prior circuits would typically use multiple off-chip reference clock signals for those applications that require multiple reference clocks. Certain embodiments may be particularly useful for possibly providing a lower-cost solution when, for example, such a circuit provides the capability to maintain tight timing, without sacrificing input pins, or excessively loading the PC board's clock driver. Various embodiments of such circuits include an ASIC or those using any chip implementation technology or combinations of technologies, including but not limited to VLSI design and discrete components.

As used herein, the term "system" is used generically herein to describe any number of components, elements, sub-systems, devices, packet switch elements, packet switches, networks, computer and/or communication devices or mechanisms, or combinations of components thereof. The term "computer" is used generically herein to describe any number of computers, including, but not limited to personal computers, embedded processors, ASICs, chips, workstations, mainframes, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating address spaces, a routine of a library and/or standalone application, and is not limited to any particular memory partitioning technique. The terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The terms "first," ""second," etc. are typically used herein to denote different units (e.g., a first element, a second element). The use of these terms herein does not necessarily connote an ordering such as one unit or event occurring or coming before the another, but rather provides a mechanism to distinguish between particular units.

Figure 2:
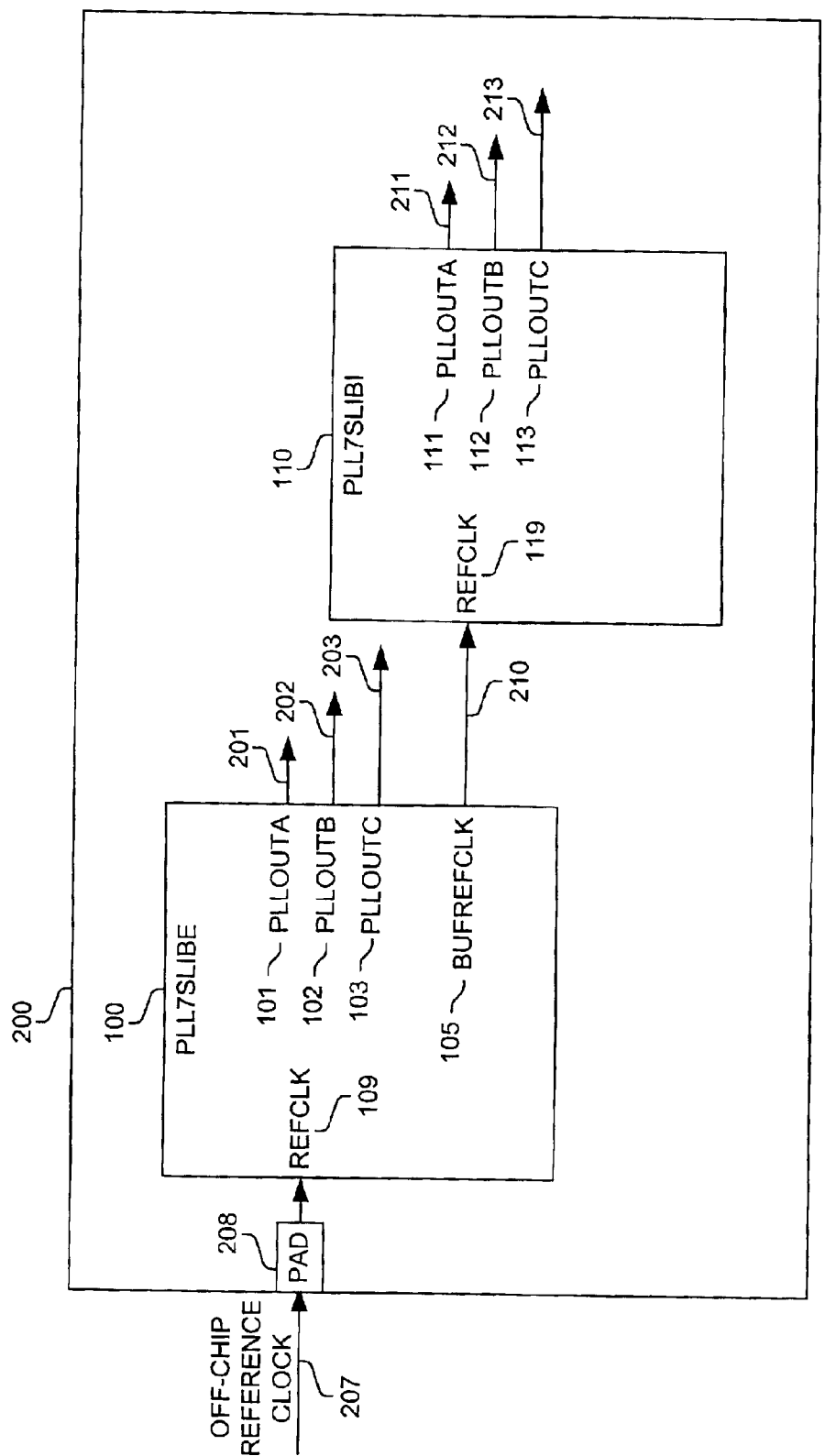
FIG. 2 is a block diagram of one embodiment of a circuit for providing multiple clock signals on a chip using a second PLL library circuit connected to a buffered reference clock output of a first PLL library circuit.

Circuit 200 illustrated in FIG. 2 illustrates one embodiment for providing multiple clock signals on a chip using a second phase-locked loop (PLL) library circuit connected to a buffered reference clock output of a first PLL library circuit. In at least one application, circuit 200 provides the capability to maintain tight timing, without sacrificing input pins, or excessively loading the PC board's clock driver. Circuit 200 may implemented as an ASIC or using any chip implementation technology or combinations of technologies, including but not limited to VLSI design and discrete components.

As shown in FIG. 2, circuit 200 includes a pad 208 which receives the off-chip reference clock signal 207, which is electrically coupled to REFCLK input 109 of library circuit or macro 100. First PLL circuit 100 provides a first set of one or more phase-locked loop clock outputs 101–103 and a buffered reference clock output 105. BUFREFCLK output 105 is electrically coupled via link 210 to REFCLK input 119 of library circuit or macro 110, which in turn provides a second set of one or more phase-locked loop clock outputs 11–113.

In the past, typically multiple off-chip reference clock signals would have been used to in those applications that require multiple reference clocks. However, the embodiment illustrated by circuit 200 may be particularly useful for possibly providing a lower-cost solution when one PLL requires tight timing with the reference clock to produce one or more clock signals 201–203, while the other PLL simply needs a clock to reference a frequency to produce one or more clock signals 211–213. Moreover, embodiments are not limited to any particular library circuits or macros. Rather, the invention is extensible to an unlimited number of circuits, including, but not limited to the library circuits and macros disclosed herein.

Figure 3A:
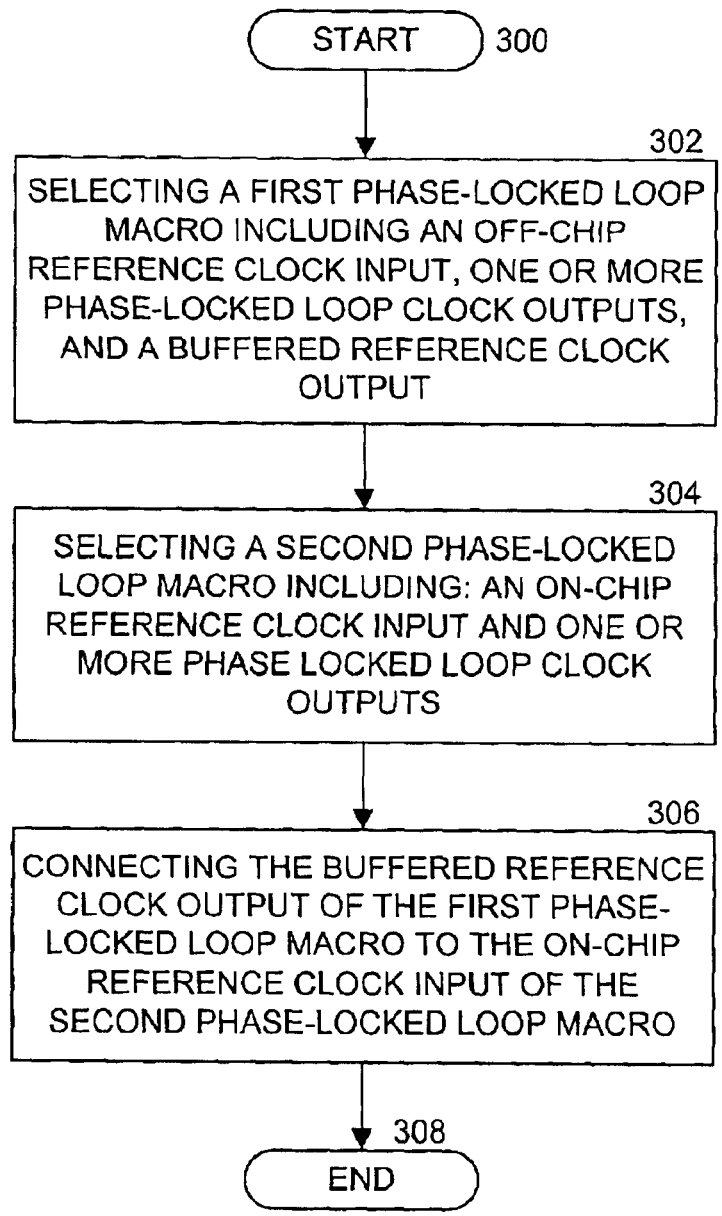
FIG. 3A is a block diagram of an embodiment of a process for designing a circuit for generating a first and a second clock reference signals.

FIG. 3A illustrates one embodiment of a process for designing a circuit for generating a first and a second clock reference signals. Processing begins at process block 300, and proceeds to process block 302 wherein a first phase-locked loop macro including an off-chip reference clock input, a first set of one or more phase-locked loop clock outputs, and a buffered reference clock output is selected. Next, in process block 304, a second phase-locked loop macro including an on-chip reference clock input and a second set of one or more phase locked loop clock outputs is selected. Next, in process block 306, the buffered reference clock output of the first phase-locked loop macro is connected to the on-chip reference clock input of the second phase-locked loop macro. In one embodiment, the circuit is included in an application-specific integrated circuit (ASIC). In one embodiment, the first phase-locked loop macro includes a buffer connected between the off-chip reference clock input and the buffered reference clock output. In one embodiment, the buffer is a non-inverting buffer, while in one embodiment the buffer is an inverting buffer.

Figure 3B:
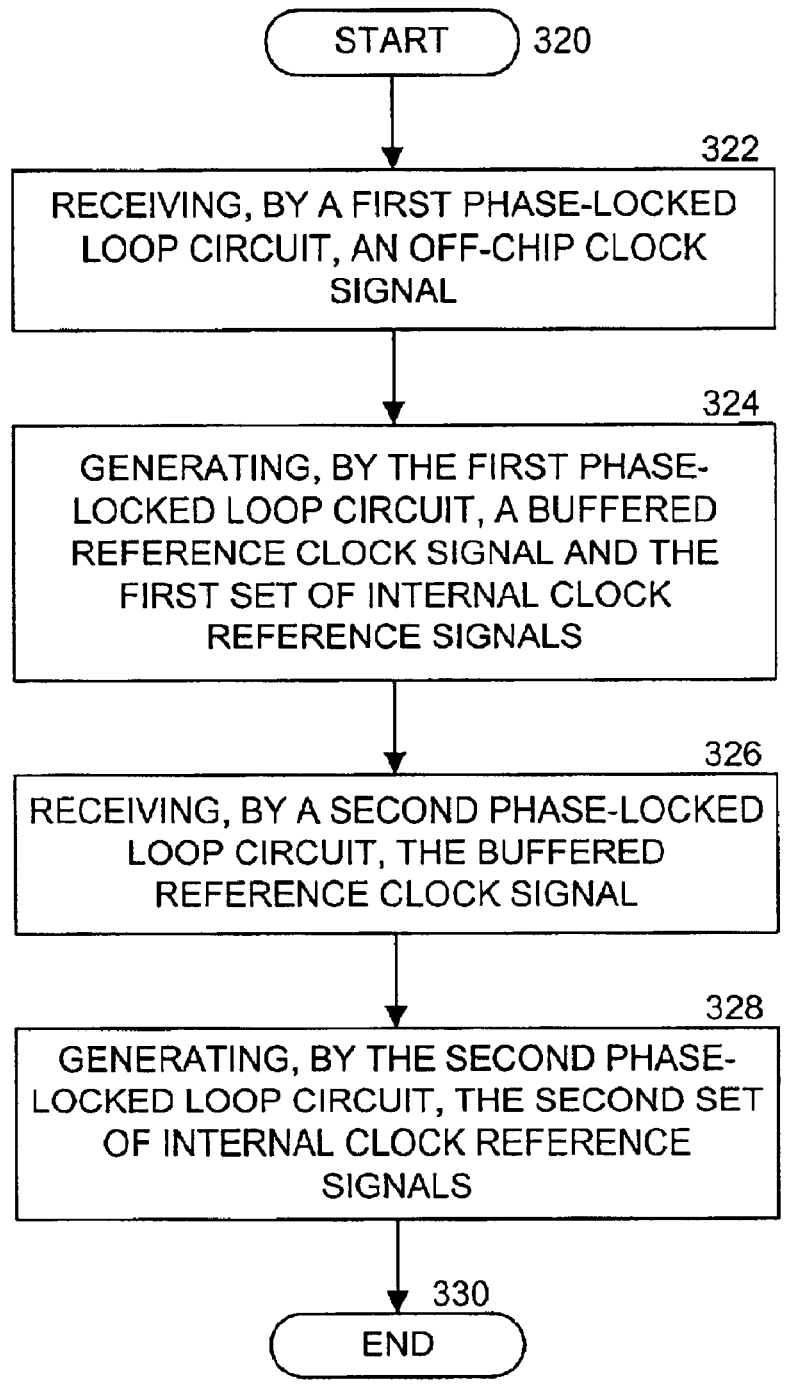
FIG. 3B is a block diagram of an embodiment of a process for generating a first and a second internal clock reference signals on a chip.

FIG. 3B illustrates one embodiment of a process for generating a first and a second internal clock reference signals on a chip. Processing begins at process block 320, and proceeds to process block 322, wherein a first phase-locked loop circuit receives an off-chip clock signal. In process block 324, the first phase-locked loop circuit generates a buffered reference clock signal and the first set of internal clock reference signals. In process block 326, a second phase-locked loop circuit receives the buffered reference clock signal. In process block 328, the second phase-locked loop circuit generates the second set of internal clock reference signals. In one embodiment, the chip includes an application-specific integrated circuit (ASIC). In one embodiment, the buffered reference clock signal input is a non-inverted representation of the received off-chip clock signal, while in one embodiment, the buffered reference clock signal input is an inverted representation of the received off-chip clock signal.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An application-specific integrated circuit (ASIC) comprising:
   a first phase-locked loop circuit including; an off-chip reference clock input, a first set of one or more phase-locked loop clock outputs, a buffered reference clock output, and a buffer electrically connected to the off-chip reference clock input and the buffered reference clock output, and wherein the first phase-locked loop circuit is defined in one or more predefined libraries of circuits; and
   a second phase-locked loop circuit including: an on-chip reference clock input and a second set of one or more phase-locked loop clock outputs, wherein the second phase-locked loop circuit is defined in said one or more predefined libraries of circuits and is specified to be connected to an output of a receiver on the ASIC;
   wherein the buffered reference clock output of the first phase-locked loop circuit is electrically coupled to the on-chip reference clock input of the second phase-locked loop circuit.

2. The ASIC of claim 1, wherein the first set of one or more phase-locked loop clock outputs of the first phase-locked loop circuit includes at least two phase-locked loop clock outputs.

3. The ASIC of claim 1, wherein the off-chip reference clock input of the first phase-locked loop circuit is directly electrically coupled to a pad of a chip.

4. An application-specific integrated circuit (ASIC) for receiving an external clock input to generate a first internal clock signal and a second internal clock signal, the ASIC comprising:
   a first phase-locked loop circuit means including an off-chip reference clock input, a first set of one or more phase-locked loop clock outputs, a buffered reference clock output, and means for buffering a received off-chip reference clock signal electrically coupled to the off-chip reference clock input and the buffered reference clock output wherein the first phase-locked loop circuit means is defined in one or more predefined libraries of circuits: and
   a second phase-locked loop circuit means including an on-chip reference clock input and a second set of one or more phase locked loop clock outputs, wherein the second phase-locked loop circuit means is defined in said one or more predefined libraries of circuits and is specified to be connected to an output of a receiver on the ASIC;
   wherein the buffered reference clock output of the first phase-locked loop circuit means is electrically coupled to the on-chip reference clock input of the second phase-locked loop circuit means.

5. The ASIC of claim 4, wherein the first set of one or more phase-locked loop clock outputs of the first phase-locked loop circuit means includes at least two phase-locked loop clock outputs.

6. The ASIC of claim 4, wherein the off-chip reference clock input of the first phase-locked loop circuit means is directly electrically coupled to a pad of a chip.

* * * * *

UNITED STATES PATENT AND TRADEMARK OFFICE
CERTIFICATE OF CORRECTION

PATENT NO. : 6,798,257 B1
DATED : September 28, 2004
INVENTOR(S) : David Roe

It is certified that error appears in the above-identified patent and that said Letters Patent is hereby corrected as shown below:

Column 4,
Line 21, replace "11-113" with -- 111-113 --.

Column 5,
Line 22, replace "including;" with -- including: --.

Column 6,
Line 18, replace "output" with -- output, --.
Line 20, replace "circuits:" with -- circuits; --.

Signed and Sealed this

Thirteenth Day of September, 2005

JON W. DUDAS
*Director of the United States Patent and Trademark Office*